US 6,724,670 B2

(12) United States Patent
Jones et al.

(10) Patent No.: US 6,724,670 B2
(45) Date of Patent: *Apr. 20, 2004

(54) SHARED REDUNDANCY FOR MEMORY HAVING COLUMN ADDRESSING

(75) Inventors: William F. Jones, Boise, ID (US); Wen Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/277,063

(22) Filed: Oct. 21, 2002

(65) Prior Publication Data

US 2003/0086310 A1 May 8, 2003

Related U.S. Application Data

(63) Continuation of application No. 09/781,808, filed on Feb. 12, 2001, now Pat. No. 6,480,429.

(51) Int. Cl.[7] ................................................ G11C 7/00
(52) U.S. Cl. ...................... 365/200; 365/225.7; 365/235
(58) Field of Search ................................. 365/200, 201, 365/233, 225.7, 235, 230.03, 210

(56) References Cited

U.S. PATENT DOCUMENTS

| 4,380,066 | A |   | 4/1983  | Spencer et al. ............... 714/6     |
|-----------|---|---|---------|-----------------------------------------|
| 5,270,976 | A | * | 12/1993 | Tran ........................... 365/200 |
| 5,901,095 | A |   | 5/1999  | Crafts ......................... 365/200 |
| 5,933,382 | A |   | 8/1999  | Yi et al. .................... 365/225.7 |
| 5,950,223 | A |   | 9/1999  | Chiang et al. ............... 711/105    |
| 5,978,291 | A | * | 11/1999 | Kirihata ....................... 365/200 |
| 6,130,853 | A |   | 10/2000 | Wang et al. ........... 365/230.06       |
| 6,134,179 | A |   | 10/2000 | Ooishi ........................ 365/233  |
| 6,154,389 | A |   | 11/2000 | Chung et al. .......... 365/185.09       |
| 6,166,970 | A |   | 12/2000 | Yun ........................... 365/191  |
| 6,178,126 | B1 |  | 1/2001  | Kirihata et al. ............. 365/200    |
| 6,301,187 | B1 | * | 10/2001 | Ooishi et al. ................ 365/233   |
| 6,473,358 | B2 | * | 10/2002 | Noda et al. ............. 365/230.06     |
| 6,480,429 | B2 | * | 11/2002 | Jones et al. ................. 365/200   |

OTHER PUBLICATIONS

Hideharu Yahata, et al., "A 256–Mb Double–Data–Rate SDRAM with a 10–mW Analog DLL Circuit," 2000 Symposium on VLSI Circuits Digest of Technical Papers, p. 74–75, Jun. 15–17, 2000.

* cited by examiner

Primary Examiner—Gene Auduong
(74) Attorney, Agent, or Firm—Fletcher Yoder

(57) ABSTRACT

A shared redundancy prefetch scheme to provide a reduced number of fuses. DDR SDRAMs allow burst addressing at various burst lengths. DDR SDRAMs generally implement LEFT and RIGHT segment column addressing. In DDR SDRAMs which implement redundant memory arrays, fuses may be used to provide access to the redundant columns. Because burst addressing may begin with a RIGHT segment address, two different columns may be accessed on the same clock cycle. By providing a compare scheme which implements separate compare logic for the lower bits of the LEFT and RIGHT segments and compares these bits to a common fuse set used for both the LEFT and RIGHT segments, the number of fuses in the redundant DDR SDRAM scheme can be reduced.

18 Claims, 4 Drawing Sheets

SHARED REDUNDANCY FOR MEMORY HAVING COLUMN ADDRESSING

This application is a continuation of U.S. application Ser. No. 09/781,808, filed Feb. 12, 2001, now U.S. Pat. No. 6,480,429.

BACKGROUND OF THE INVENTION

1. Field of the Invention

The present invention relates generally to redundant memory and, more particularly, to a two-bit prefetch scheme in a redundant memory system.

2. Description of the Related Art

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Microprocessor-controlled integrated circuits are used in a wide variety of applications. Such applications include personal computers, vehicle control systems, telephone networks, and a host of consumer products. As is well known, microprocessors are essentially generic devices that perform specific functions under the control of a software program. This program is stored in a memory device which is coupled to the microprocessor. Not only does the microprocessor access memory devices to retrieve the program instructions, but it also stores and retrieves data created during execution of the program in one or more memory devices.

There are a variety of different memory devices available for use in microprocessor-based systems. The type of memory device chosen for a specific function within a microprocessor-based system depends largely upon what features of the memory are best suited to perform the particular function. Memory manufacturers provide an array of innovative fast memory chips for various applications. While both Dynamic Random Access Memories (DRAM) and Static Random Access Memories (SRAM) are making significant gains in speed and bandwith, even the fastest memory devices cannot match the speed requirements of most microprocessors.

Another type of memory device is a standard Synchronous Dynamic Random Access Memory (SDRAM). Synchronous control means that the DRAM latches information from the processor under the control of the system clock. The processor can be told how many clock cycles it takes for the DRAM to complete its task so it can safely implement other tasks while the DRAM is processing its request. Regardless of the type of memory, the solution for providing adequate memory bandwith depends on system architecture, the application requirements, and the processor, all of which help determine the best memory type for a given application. Limitations on speed include delays in the chip, the package, and the system. Thus, significant research and development has been devoted to finding faster ways to access memory.

Because microprocessor technology enables current microprocessors to operate faster than current memory devices, techniques for increasing the speed of memory devices are often implemented. One technique for increasing the speed of a SDRAM is called a "prefetch." In a prefetch system, more than one data word is fetched from the memory on each address cycle. The data may be temporarily stored in a buffer. Multiple words of data can then be sequentially clocked out for each address access. The main advantage of this approach is that for any given technology data can be accessed in multiples of the internal clock rate of the DRAM.

In a Double Data Rate (DDR) memory, the data transfer rate is twice that of a regular SDRAM because the DDR's I/O data can be strobed twice for every clock cycle. Thus, data is sent on both the rising and falling edge of the clock signal rather than just the rising edge of the clock signal as in typical Single Data Rate (SDR) systems. With the increase of data output bandwith, DDR provides a method of doubling the data rate of the memory device. In implementing DDR, two bits or segments are prefetched and stored at a single column address. Generally, the operational speed of the memory device in the two bit prefetch method is doubled, and the data is temporarily stored in a latch circuit. Each segment of data is processed on either the rising or falling edge of the clock signal. Since two segments of data for a single column address are prefetched with each clock cycle, the data may be defined and stored in two locations corresponding to a single column address. This may be referred to as "left" and "right" data or, alternatively, as "even" and "odd" data for a single column address.

Another area of memory technology that has been improved is memory fault protection. When a memory device such as an SDRAM is manufactured, there may be various anomalies in various memory cells of the device. During electrical testing of a memory device at the manufacturer, faulty memory cells may be detected. To minimize the impact of such failures, redundant row and column segments are often provided to replace the normal memory addresses detected as faulty during electrical testing. A redundant memory row or column circuit typically includes a set of programmable fuses, one for each address bit. When a fault is detected in a cell of the original memory array, fuses can be programmed to provide access to one of the redundant rows or columns. This will provide a replacement cell from a redundant array for the faulty cell in the original memory array. Conversely, antifuses may be used to open paths to the faulty memory cells. Disadvantageously, fuses are fairly large and require additional space on the memory device.

When combining redundant memory technology with DDR SDRAM technology, fuses may be used for each segment (LEFT/RIGHT) of each column address to provide a path for the possible implementation of a redundant memory circuit. Disadvantageously, fuses are comparatively large and take up valuable real estate which may be used for memory storage. Because memory real estate may be at a premium, it would be advantageous to implement the advances used in DDR SDRAM technology and redundant memory technology while minimizing the circuitry associated with the advanced DDR SDRAM and redundancy technologies.

The present invention may address one or more of the problems set forth above.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation may be described in the specification. It should be appreciated that in the development of any such actual implementation, as in any engineering or design project, numerous implementation-specific decisions are made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
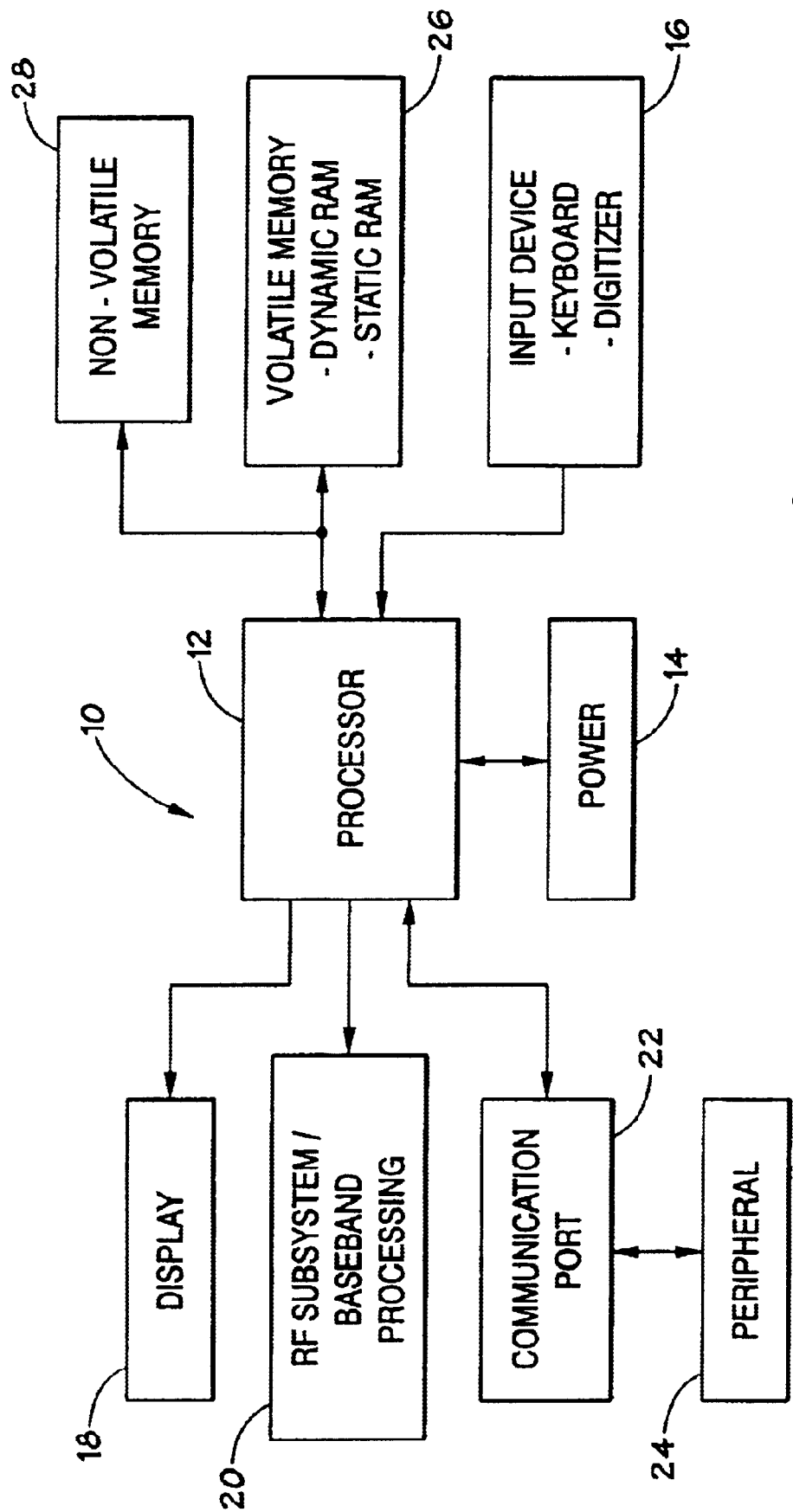
FIG. 1 illustrates a block diagram of an exemplary processor-based device in accordance with the present technique.

Turning now to the drawings, and referring initially to FIG. 1, a block diagram depicting an exemplary processor-based device, generally designated by the reference numeral 10, is illustrated. The device 10 may be any of a variety of different types, such as a computer, pager, cellular telephone, personal organizer, control circuit, etc. In a typical processor-based device, a processor 12, such as a microprocessor, controls many of the functions of the device 10.

The device 10 typically includes a power supply 14. For instance, if the device 10 is portable, the power supply 14 would advantageously include permanent batteries, replaceable batteries, and/or rechargeable batteries. The power supply 14 may also include an A/C adapter, so that the device may be plugged into a wall outlet, for instance. In fact, the power supply 14 may also include a D/C adapter, so that the device 10 may be plugged into a vehicle's cigarette lighter, for instance.

Various other devices may be coupled to the processor 12, depending upon the functions that the device 10 performs. For instance, a user interface 16 may be coupled to the processor 12. The user interface 16 may include buttons, switches, a keyboard, a light pin, a mouse, and/or a voice recognition system, for instance. A display 18 may also be coupled to the processor 12. The display 18 may include an LCD display, a CRT, LEDs, and/or an audio display. Furthermore, an RF subsystem/baseband processor 20 may also be coupled to the processor 12. The RF subsystem/baseband processor 20 may include an antenna that is coupled to an RF receiver and to an RF transmitter (not shown). A communications port 22 may also be coupled to the processor 12. The communications port 22 may be adapted to be coupled to a peripheral device 24, such as a modem, a printer, or a computer, for instance, or to a network, such as a local area network or the Internet.

Because the processor 12 controls the functioning of the device 10 generally under the control of software programming, memory is coupled to the processor 12 to store and facilitate execution of the program. For instance, the processor 12 may be coupled to volatile memory 26, which may include dynamic random access memory (DRAM), static random access memory (SRAM), Double Data Rate (DDR) memory, etc. The processor 12 may also be coupled to non-volatile memory 28. The non-volatile memory 28 may include a read only memory (ROM), such as an EPROM or Flash-Memory, to be used in conjunction with the volatile memory. The size of the ROM is typically selected to be just large enough to store any necessary operating system, application programs, and fixed data. The volatile memory, on the other hand, is typically quite large so that it can store dynamically loaded applications. Additionally, the non-volatile memory 28 may include a high capacity memory such as a disk drive, tape drive memory, CD ROM drive, DVD, read/write CD ROM drive, and/or a floppy disk drive.

The volatile memory 26 may include a number of SDRAMs which implement DDR technology in conjunction with redundant fault protection. Memory devices frequently access data in blocks where the block length or "burst" is variable. During a burst-2 memory access, two data segments corresponding to a single address may be prefetched and delivered on the rising and falling edge of the clock signal. A burst-4 memory access provides four data segments, two segments for each address. Likewise, a burst-8 access provides eight data segments with each access.

The following illustration in Table 1 may be helpful. It should be understood that while only three address bits are illustrated for the sake of clarity, each column address may comprise more address bits. Typically, each column address may comprise 8 bits (A0–A7).

TABLE 1

|  | A2 | A1 | A0 | Segment | Line |
|---|---|---|---|---|---|
| Column Address 1 | 0 | 0 | 0 | LEFT | 1 |
|  | 0 | 0 | 1 | RIGHT | 2 |
| Column Address 2 | 0 | 1 | 0 | LEFT | 3 |
|  | 0 | 1 | 1 | RIGHT | 4 |
| Column Address 3 | 1 | 0 | 0 | LEFT | 5 |
|  | 1 | 0 | 1 | RIGHT | 6 |
| Column Address 4 | 1 | 1 | 0 | LEFT | 7 |
|  | 1 | 1 | 1 | RIGHT | 8 |

In a DDR system, two data segments are accessed on the first clock cycle. Thus, in the example above, lines 1 and 2 may be accessed during the first clock cycle. In a burst-2 access, only lines 1 and 2 are accessed with each request. In a burst-4 system, lines 1–4 are accessed, while a burst-8 system accesses lines 1–8 with each request. If the access to the storage is sequential, address segments are accessed sequentially. This storage type information is necessary to determine successive column addresses. Further, the starting address of the first access may vary. If the first access is line 1, the second access will be line 2, the third access will be line 3, and so forth. Similarly, if the first access is line 2, the second access will be line 3, the third access will be line 4, and so forth. If the first access is line 8, the second access will be line 1, the third access will be line 2, and so forth.

Referring again to Table 1, four addresses are illustrated. Each address includes a LEFT and a RIGHT column segment. Each odd line number illustrates a LEFT segment, while each even line number depicts a RIGHT segment. This information is also stored in the A0 bit of each address. If the A0 bit in the address is a logical 0, for example, as in lines 1, 3, 5, and 7, the LEFT segment of the column address is accessed and provides the rising edge bit. Conversely, if the A0 bit in the column address is a logical 1, for example, the RIGHT segment of the column address is accessed and provides the rising edge bit. Thus, the A0 bit of the column address determines which segment of the address provides the rising and the falling edge data bits. In a sequential system, the segments alternate. Thus, if a LEFT segment of one address is accessed on the rising edge of a clock pulse, a RIGHT segment of the same address is accessed on the falling edge of the clock pulse. If a RIGHT segment of one address is accessed on the rising edge of a clock pulse, a LEFT segment of the next address is accessed on the falling edge of the clock pulse. Because each two data bit access includes only one column address, it is important to determine the arrangement of the memory to determine the proper address and segment for each subsequent segment storage.

Continuing with the example illustrated in Table 1, if line 1 is initially accessed and the burst length is 8, each line 1–8 will be accessed with the initial request. By providing the starting address, e.g. 000, each subsequent address access can be determined from the access type, e.g. sequential, and the segment, e.g. LEFT. Thus, a counter in the access circuit will increment the address by 1 and alternate between the LEFT and RIGHT segments until each of the eight memory cells have been accessed.

Redundancy circuits add one additional variable that should also be considered in the present system. As previously discussed, faulty memory cells in the original array may be replaced with redundant memory cells by using fuses/anti-fuses to provide a path from the faulty memory cell location to the replacement redundant cell. Because the access address remains the same, the memory system must determine whether an access is going to the original array or a redundant array. During manufacture, address fuse states corresponding to faulty memory locations are programmed or "blown." A blown (shorted) antifuse corresponds to an input bit of 0; an unblown (open) antifuse corresponds to an input address bit of 1. If all address unit levels for a given input address correspond or "match" the states of a set of redundant fuses, the redundant memory element is accessed in place of the faulty element.

By adding redundancy to the memory system, subsequent storage locations can no longer be determined from the starting address, the access type, and the segment. With the addition of redundancy, information must be provided for the system to determine which accesses should be directed to the original memory array and which accesses should be directed to the redundant memory array. If the A1 bit in the initial address being accessed is a 0, there is no indication as to whether the next address in the single access should be directed to the original memory array or the redundant memory array, since the initial address does not provide information regarding the redundancy of subsequent addresses.

Figure 2:
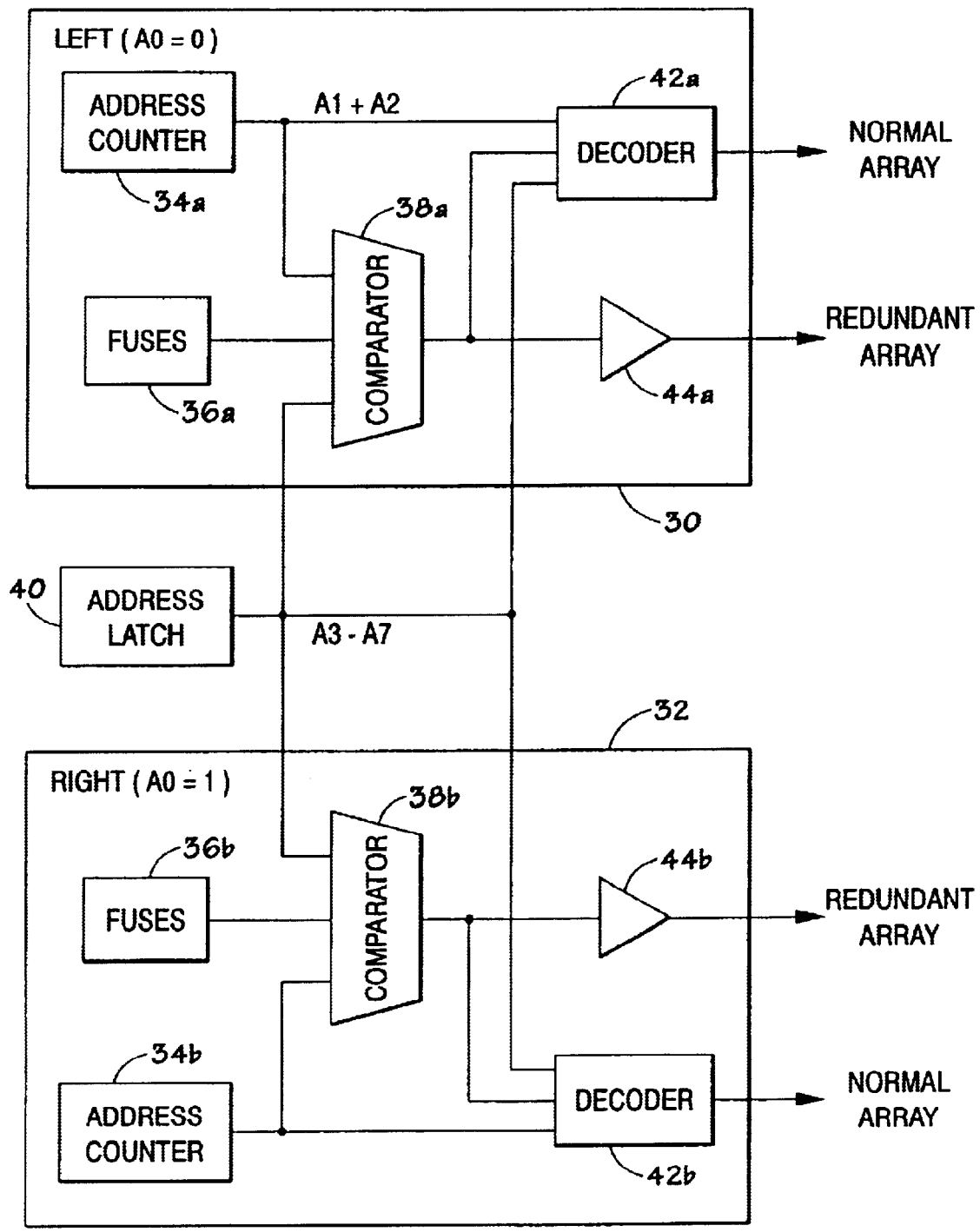
FIG. 2 illustrates a block diagram of an exemplary column redundancy circuit.

To address this problem, redundant memory arrays which implement DDR prefetch schemes may implement compare circuits to check the state of the fuse corresponding to each bit of the column address, as illustrated in FIG. 2. Each segment block, LEFT segment block 30 and RIGHT segment block 32, include identical components for implementing the access to the LEFT and RIGHT segments corresponding to each address. For simplicity, common elements within each segment block 30 and 32 are labeled with similar reference numerals. The LEFT segment block 30 includes an address counter 34a to increment the address after the initial access to determine the access location of subsequent memory cells. Further, the LEFT segment block 30 includes a fuse block 36a. The fuse block 36a includes a fuse for each bit of each address such that a fuse may be blown at manufacture for any faulty memory cell, as discussed above. If the address input matches the predetermined fuse states for a faulty address location, the memory access will be directed to the redundant memory. Thus, a compare circuit 38a may be used to determine whether input address bits match programmed fuse states. Each address bit A1 and A2 is compared to the state of each corresponding fuse. Similarly, the address bits A3–A7 are compared to the fuse states of their corresponding fuses. Because burst 2, burst 4, and burst 8 systems only provide for variations in the first 3 bits of the address (A0–A2), a single address latch 40 may be used for the address bits A3–A7 since these bits will not change. If a higher burst count is implemented, compare logic for higher order bits may be separated between the LEFT and RIGHT segment blocks 30 and 32. If after comparing each address bit to its corresponding fuse state, the compare circuit 38a determines that there is no MATCH between the address and the state of the fuse, the decoder 42a determines which address location should be accessed. However, if the compare circuit 38a determines that there is a MATCH between the address and the state of one of the fuses, the redundant array is accessed instead through a latch 44a. Similarly, the RIGHT segment block includes an address counter 34b, fuses 36b, a compare circuit 38b, a decoder 42b and a latch 44b to provide the redundancy compare circuit for the RIGHT segment.

Returning to the discussion of Table 1 and applying the redundant circuit described with reference to FIG. 2, all information for determining memory access is now present. If line 1 is initially accessed, the segment type and fuse state can be determined from the original address. However, while the proper column address and segment type can be determined for line 3 based on the initial address, the fuse state may not be determined since the A1 bit of the address in line 3 is not sent in a burst 4 or burst 8. Thus, the system can not determine whether to access the original memory array or the redundant memory array. However, since each column address bit is compared to the actual fuse state of the corresponding fuse through a compare circuit, the circuit will provide the information pertaining to redundancy for each subsequent column segment.

While the circuit described in FIG. 2 provides a redundant memory system which implements DDR SDRAMs, the number of fuses used is disadvantageously large, since at least 8 total fuses are used for each redundant column segment. To reduce the number of fuses implemented in the redundant memory system, the LEFT and RIGHT segments may share common fuses for each address bit, thereby halving the number of fuses used in the redundancy circuit. This is possible because the fuses for the LEFT and RIGHT segments described in FIG. 2 are usually blown in pairs. Each time the LEFT segment fuse is blown for a given address bit, the RIGHT segment bit is also blown. Because both fuses share the same state, they can be combined into a single fuse. One problem in implementing this approach with the system described in FIG. 2 is that because DDR segments share a common address, the starting address of an access may not be an LEFT address. Because the system implements sequential addressing, a starting column address with A0=1, will increment A1 to the opposite state for the falling edge data bit. Since A1 is an address bit that compares to a fuse, it will compare differently for the RIGHT and LEFT column segments. Because two different addresses may be accessed in the same cycle, two sets of independent circuits and fuses for RIGHT and LEFT addresses are therefore used in the conventional column redundancy circuit as illustrated in FIG. 2.

Figure 3:
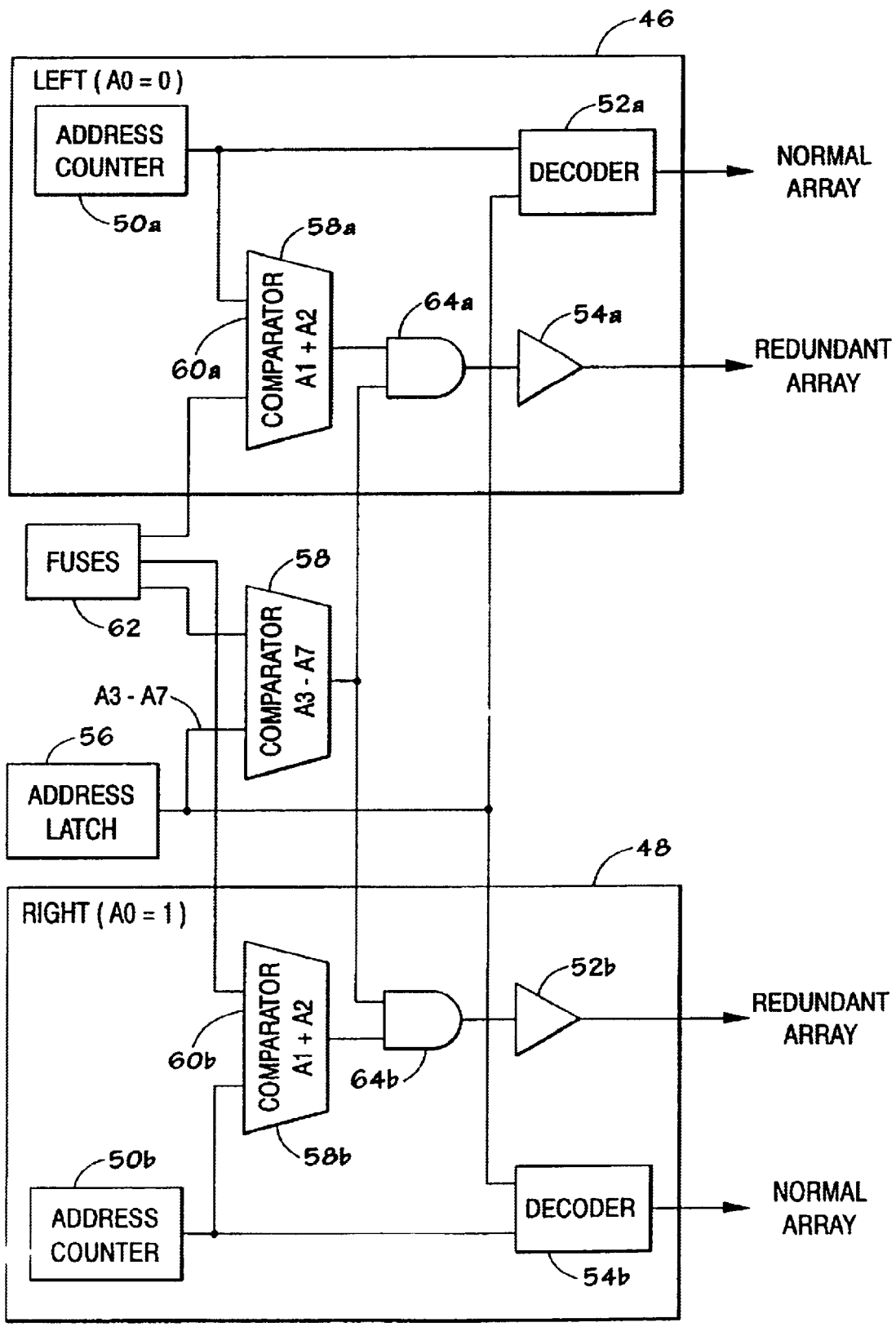
FIG. 3 illustrates a block diagram of an exemplary column redundancy circuit in accordance with the present technique.

To address this problem, FIG. 3 illustrates a block diagram of a redundancy circuit with a reduced number of fuses. Specifically, the number of fuses is halved since both the LEFT and RIGHT segments for a single address share a common fuse. In the circuit depicted in FIG. 3, a LEFT segment block 46 and a RIGHT segment block 48 are illustrated. Each memory segment block 46 and 48 includes an address counter 50a and 50b, a decoder 52a and 52b, and a latch 54a and 54b, respectively, as previously described with reference to FIG. 2. Further, the address latch 56 for the upper bits of the address is common to the LEFT and RIGHT memory segments 46 and 48. Here however, rather than use a single compare logic circuit for the entire address for each of the LEFT segment 46 and the RIGHT segment 48, a single compare logic circuit 58 may be used for the upper level bits A3–A7 of both segments 46 and 48. As previously described, a burst length of 2, 4, or 8 will only affect the first three bits of the address. Thus, each of the bits of the upper level of the address A3–A7 will be the same and common compare logic 58 may be used between the two segments 46 and 48. Separate compare logic 60a and 60b are retained for the lower address bits A1 and A2 of the LEFT and RIGHT segments 46 and 48.

Because the initial address may be a RIGHT (or odd) address, two different column address bits A1 and A2 may fire to provide the rising and falling edge of the data. By implementing the common set of redundancy fuses 62 while using the separate match logic in the compare logic 60a and 60b, a redundant column is allowed to fire for one of the two array segments if only one of the two columns requires redundant access. By combining the output of the lower compare logic 60a and 60b with that of the upper compare logic 58 using logical AND gates 64A and 64B, the present circuit provides a means of insuring the correct address and segment access while only implementing a single fuse for each address bit. The fuse block 62 may include seven fuses (one fuse for each address bit A1–A7) as well as an enable fuse to enable the set of redundant fuses included in the fuse block 62 and enable the compare logic.

Figure 4:
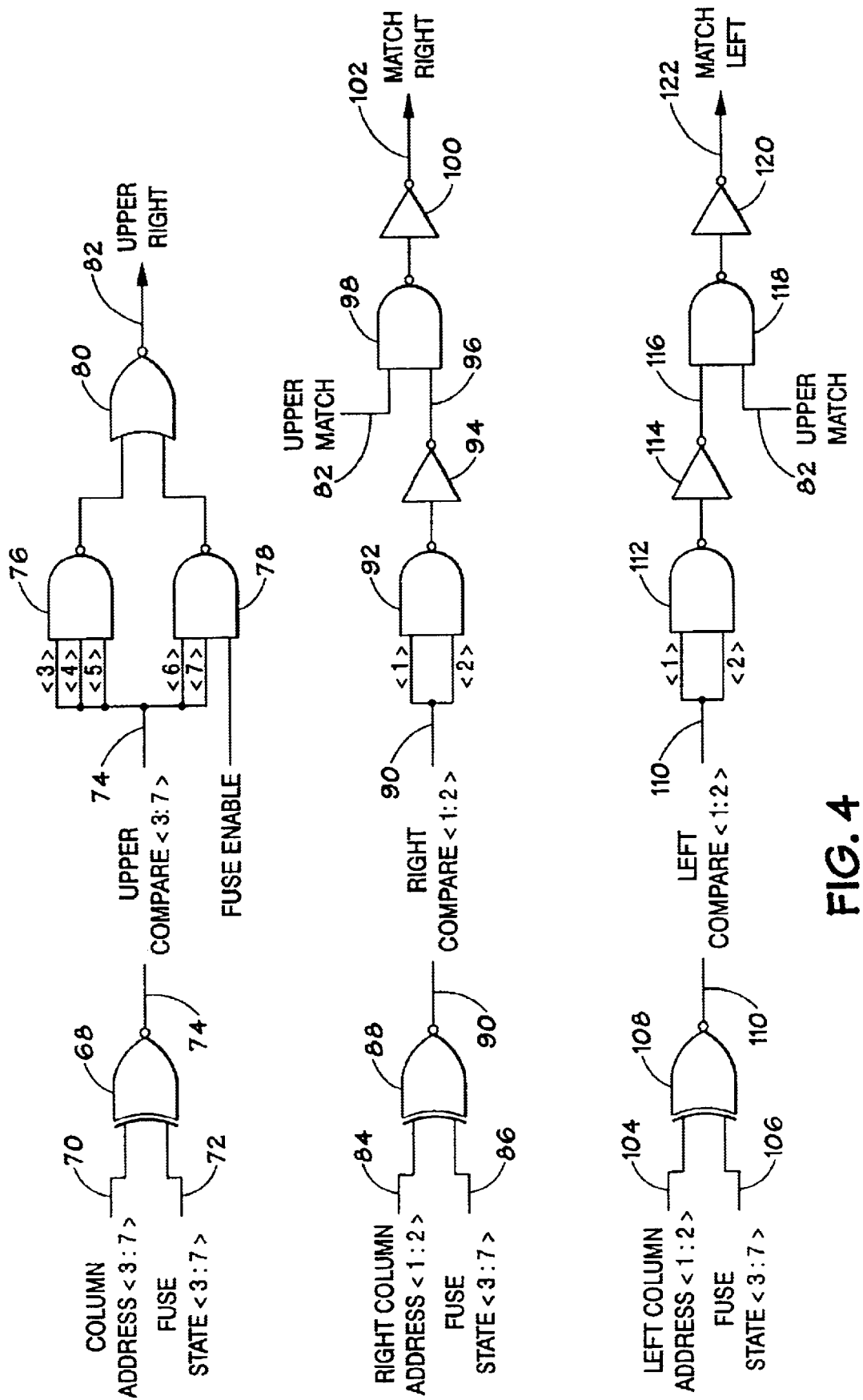
FIG. 4 illustrates a schematic drawing of an exemplary column redundancy circuit in accordance with the present technique.

FIG. 4 illustrates a schematic drawing of one embodiment of the compare logic 60a, 60b, and 58 for the shared redundancy scheme illustrated in FIG. 3. Initially, within each compare logic 60a, 60b, and 58, the respective column address is delivered to the input of an exclusive NOR (XNOR) gate. Specifically, in the compare logic 58, an XNOR gate 68 compares each bit of the upper address A3–A7 to the actual state of the corresponding fuse as indicated by the inputs 70 and 72. The output of the XNOR gate 68 is indicated by reference numeral 74. By combining each output signal 74 through NAND gates 76 and 78 and further through a NOR gate 80, an output signal 82 indicates whether all of the fuses associated with the upper address bits A3–A7 match the input column addresses A3–A7. The output 82 will be further combined with similar signals corresponding to the lower address bits as described below to determine whether all of the fuses associated with the bits of that column address match the input column address thereby indicating that the redundant column should be accessed.

Because the burst may begin with a RIGHT (or odd) segment address, the compare logic for the affected lower bits of the address are separated. Separate compare logic for the LEFT and RIGHT segments may be used to compare the lower bits A1 and A2 to the same respective fuse for each bit of the LEFT and RIGHT segment. The compare circuit 60a receives the RIGHT segment of the lower address bits A1 and A2 and in the actual fuse states of the corresponding fuses at inputs 84 and 86. The inputs are combined through an XNOR gate 88 to produce a RIGHT compare output signal 90 for each address bit. The RIGHT compare output signals 90 for each address bit A1 and A2 of the RIGHT compare circuit are then combined through a NAND gate 92 and an inverter 94 to produce an output 96. The output 96 indicates whether the fuses associated with the lower address bits A1 and A2 in the RIGHT match the input column address bits A1 and A2. The output 96 may then be combined with the output 82 which indicates whether any of the fuses associated with the upper address bits A3–A7 match A3–A7, as described above. These signals may be combined through a NAND gate 98 and an inverter 100. The effect of the present circuit is to produce an output 102 which will indicate if a MATCH was detected for all address bits A1–A7 in the RIGHT address segment. If all fuse states match the corresponding column address bits, the compare logic will indicate that a match has been detected at the output 102 and the redundant memory array will be accessed.

Similarly, for the LEFT segment, the compare logic 60b receives the LEFT segment of the lower address bits A1 and A2 and the actual fuse states of the corresponding fuses at inputs 104 and 106. The inputs are combined through an XNOR gate 108 to produce a LEFT compare output signal 110 for each address bit. The LEFT compare output signals 110 for each address bit A1 and A2 of the LEFT compare circuit are then combined through a NAND gate 112 and an inverter 114 to produce an output 116. The output 116 will indicate whether the fuses associated with the lower address bits A1 and A2 in the LEFT match the column address inputs A1 and A2. The output 116 may then be combined with the output 82 which indicates whether the fuses associated with the upper address bits A3–A7 match A3–A7, as described above. These signals may be combined through a NAND gate 118 and an inverter 120. The effect of the present circuit is to produce an output 122 which will indicate if a "MATCH" was detected in any of the address bits A1–A7 in the LEFT address segment. If all fuse states match the corresponding column address bits, the compare logic will indicate that a match has been detected at the output 122 and the redundant memory array will be accessed.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A shared redundancy memory circuit comprising:
   a main memory portion comprising a plurality of addresses, each of the plurality of addresses comprising a plurality of address bits and each of the plurality of addresses corresponding to a first memory segment and a second memory segment;
   a redundant memory portion configured to replace one or more addresses in the main memory portion;
   a plurality of redundancy fuses, each of the plurality of redundancy fuses corresponding to one of the plurality of address bits and configured to provide access to the redundant memory portion through the plurality of addresses corresponding to the first memory segment and the second memory segment, and wherein each of the plurality of redundancy fuses is coupled to each of the first memory segment and the second memory segment; and a plurality of logical devices configured to detect the state of each of the plurality of redundancy fuses corresponding to each of the plurality of address bits.

2. The shared redundancy memory circuit, as set forth in claim 1, wherein the main memory portion comprises a plurality of double data rate synchronous dynamic random access memory (DDR SDRAM) devices.

3. The shared redundancy memory circuit, as set forth in claim 2, wherein the plurality of DDR SDRAM devices implement burst addressing.

4. The shared redundancy memory circuit, as set forth in claim 3, wherein the burst addressing comprises a burst length of four.

5. The shared redundancy memory circuit, as set forth in claim 3, wherein the burst addressing comprises a burst length of eight.

6. The shared redundancy memory circuit, as set forth in claim 1, wherein the first memory segment comprises a LEFT memory segment.

7. The shared redundancy memory circuit, as set forth in claim 1, wherein the second memory segment comprises a RIGHT memory segment.

8. The shared redundancy memory circuit, as set forth in claim 1, wherein each of the plurality of addresses comprises eight address bits.

9. The shared redundancy memory circuit, as set forth in claim 8, wherein at least one of the address bits corresponds to a segment type.

10. The shared redundancy memory circuit, as set forth in claim 1, wherein each of the plurality of redundancy fuses comprises one of a first state and a second state, the first state providing a path to a corresponding redundant memory cell in the redundant memory portion, the second state providing a path to a corresponding memory cell in the main memory portion.

11. The shared redundancy memory circuit, as set forth in claim 10, wherein each of the plurality of address bits is compared to the state of the corresponding redundancy fuses.

12. A method of prefetching data from a memory device comprising the acts of:
(a) receiving a first address bit from a first segment of the memory device, the first address bit comprising one bit of a corresponding first address;
(b) receiving a second address bit from a second segment of the memory device;
(c) comparing the first address bit to a state of a first fuse to determine if the state of the first fuse matches the first address bit; and
(d) comparing the second address bit to the state of the first fuse to determine if the state of the first fuse matches the second address bit.

13. The method of prefetching data from a memory device, as set forth in claim 12, wherein act (a) comprises the act of receiving the first address bit on the rising edge of a first clock pulse.

14. The method of prefetching data from a memory device, as set forth in claim 13, wherein act (b) comprises the act of receiving the second address bit on the falling edge of the first clock pulse.

15. A method of prefetching data from a memory device comprising the acts of:
(a) receiving a first address bit from a first segment of the memory device, the first address bit comprising one bit of a corresponding first address;
(b) receiving a second address bit from a second segment of the memory device, the second address bit comprising one bit of a corresponding second address;
(c) receiving a third address bit from the first segment of the memory device, the third address bit corresponding to the second address;
(d) comparing the first address bit to a state of a fuse to determine if the state of the first fuse matches the first address bit;
(e) comparing the second address bit to the state of the fuse to determine if the state of the second fuse matches the second address bit; and
(f) comparing the third address bit to the state of the fuse to determine if the state of the second fuse matches the third address bit.

16. The method of prefetching data from a memory device, as set forth in claim 15, wherein act (b) comprises the act of receiving the second address bit on the falling edge of a first clock pulse.

17. The method of prefetching data from a memory device, as set forth in claim 16, wherein act (b) comprises the act of receiving the third address bit on the rising edge of a second clock pulse, the second clock pulse being immediately subsequent to the first clock pulse.

18. A method of accessing a memory array in a redundant double data rate memory device, the memory array comprising a first address segment and a second address segment, each of the first address segment and the second address segments comprising the same addresses, comprising the acts of:
(a) providing a first set of compare logic corresponding to the first address segment;
(b) providing a second set of compare logic corresponding to the second address segment; and
(c) providing a plurality of fuses wherein each of the plurality of fuses is used by both the first address segment and the second address segment to provide a path to a redundant memory array.

* * * * *